US009768787B2

(12) United States Patent
Ramesh et al.

(10) Patent No.: US 9,768,787 B2
(45) Date of Patent: *Sep. 19, 2017

(54) DETECTION AND COMPENSATION OF DIELECTRIC RESONATOR OSCILLATOR FREQUENCY DRIFT

(71) Applicant: MaxLinear, Inc., Carlsbad, CA (US)

(72) Inventors: Sridhar Ramesh, Irvine, CA (US); Subramanian Anantharaman, Bangalore (IN); Harish Maller, Bangalore (IN)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/285,122

(22) Filed: Oct. 4, 2016

(65) Prior Publication Data

US 2017/0026046 A1   Jan. 26, 2017

Related U.S. Application Data

(63) Continuation of application No. 14/607,789, filed on Jan. 28, 2015, now Pat. No. 9,461,651.

(60) Provisional application No. 61/952,170, filed on Mar. 13, 2014.

(30) Foreign Application Priority Data

Jan. 30, 2014 (IN) .............................. 272/DEL/2014

(51) Int. Cl.
*H03L 7/00* (2006.01)
*H03B 5/18* (2006.01)
*H03L 1/00* (2006.01)

(52) U.S. Cl.
CPC ............. *H03L 7/00* (2013.01); *H03B 5/1864* (2013.01); *H03L 1/00* (2013.01)

(58) Field of Classification Search
CPC ......... H01P 7/10; H01P 7/105; H03B 5/1864; H03B 5/187; H03B 5/1876; H03L 7/00
USPC ................................ 331/96, 175; 333/219.1
See application file for complete search history.

(56) References Cited

U.S. PATENT DOCUMENTS

| | | | |
|---|---|---|---|
| 5,276,904 A | 1/1994 | Mutzig et al. | |
| 5,311,318 A | 5/1994 | Dobrovolny | |
| 5,315,302 A | 5/1994 | Katsukura et al. | |
| 5,697,090 A | 12/1997 | Iura | |
| 6,363,126 B1 | 3/2002 | Furukawa et al. | |
| 6,384,770 B1 | 5/2002 | de Gouy et al. | |
| 7,049,999 B1 | 5/2006 | Aker | |
| 2002/0097100 A1 | 7/2002 | Woods et al. | |
| 2003/0056157 A1 | 3/2003 | Fala et al. | |
| 2003/0232604 A1 | 12/2003 | Mocquard et al. | |
| 2004/0092237 A1 | 5/2004 | Chen | |
| 2010/0172446 A1 | 7/2010 | Popoli | |

*Primary Examiner* — Levi Gannon
(74) *Attorney, Agent, or Firm* — McAndrews, Held & Malloy, Ltd.

(57) ABSTRACT

Systems and methods are provided for detection and compensation of dielectric resonator oscillator frequency drift. DRO frequency drift detection and compensation may comprise, for a received input signal, detecting one or more channels in the input signal, determine frequency offset for each of the detected channels; determining determine dielectric resonator oscillator (DRO) frequency drift based on combining frequency offsets of the detected channels, and determining, based on the DRO frequency drift, one or more adjustments for compensating for the DRO frequency drift. The DRO frequency drift may be determined based on analysis of an intermediate signal generated during processing of the input signal.

18 Claims, 6 Drawing Sheets

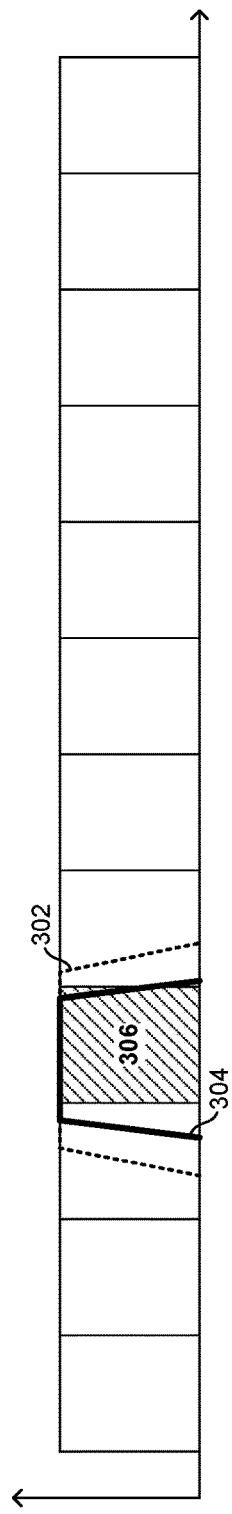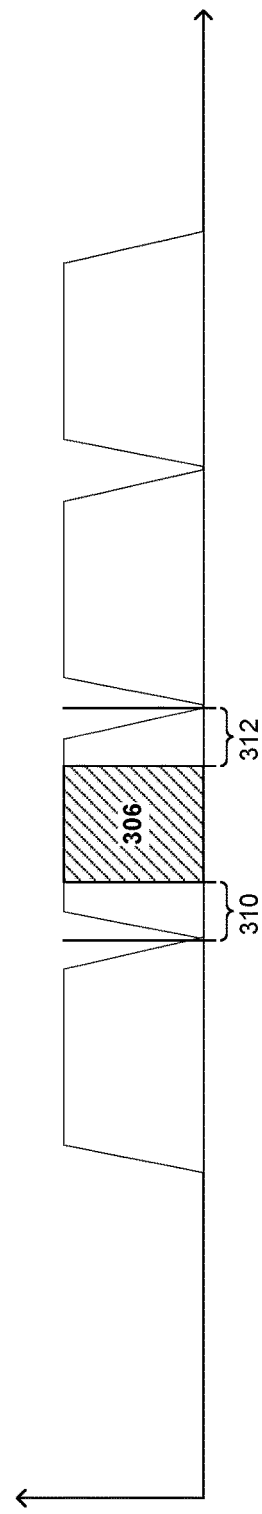

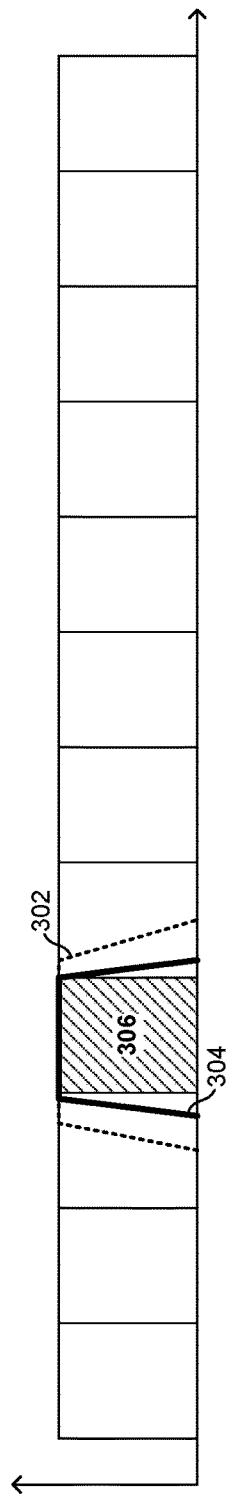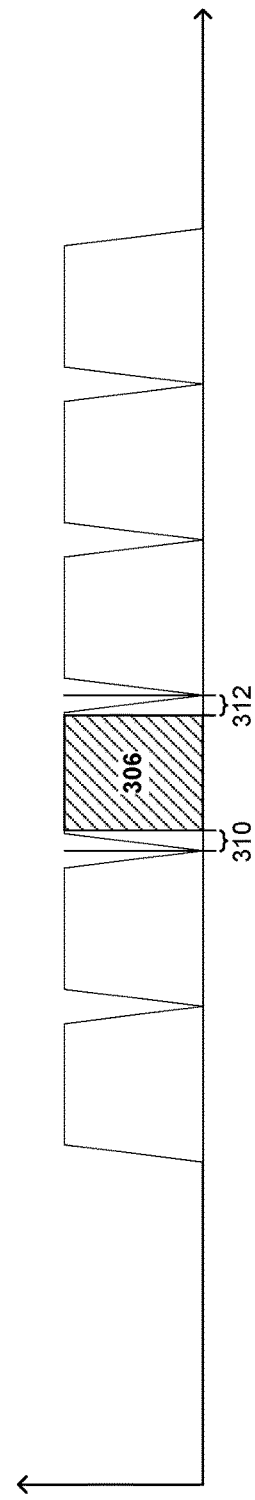

DETECTION AND COMPENSATION OF DIELECTRIC RESONATOR OSCILLATOR FREQUENCY DRIFT

CLAIM OF PRIORITY

This patent application continuation/divisional of U.S. patent application Ser. No. 14/607,789 filed on Jan. 28, 2015, which makes reference to, claims priority to and claims benefit from Indian (IN) Patent Application Serial No. 272/DEL/2014, filed on Jan. 30, 2014, and U.S. Provisional Patent Application Ser. No. 61/952,170, filed on Mar. 13, 2014.

Each of the above identified applications is hereby incorporated herein by reference in its entirety.

TECHNICAL FIELD

Aspects of the present disclosure relate to communication systems, technologies, and solutions. More specifically, certain implementations of the present disclosure relate to methods and systems for detection and compensation of dielectric resonator oscillator frequency drift.

BACKGROUND

Conventional systems and methods for dealing with frequency drift of dielectric resonator oscillators can be inefficient and ineffective. Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for detection and compensation of dielectric resonator oscillator frequency drift, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

BRIEF DESCRIPTION OF SEVERAL VIEWS OF THE DRAWINGS

FIG. 3A illustrates the need for additional margin in the bandwidth of channel filters when dielectric resonator oscillator (DRO) frequency drift is not compensated for in a system.

FIG. 3B illustrates a plurality of stacked channels output by a system that does not compensate for dielectric resonator oscillator (DRO) frequency drift.

FIG. 3C illustrates the ability to reduce margin in the bandwidth of an ODU's channel filters when dielectric resonator oscillator (DRO) frequency drift is compensated for in a system.

FIG. 3D illustrates a plurality of stacked channels output by a system that is operable to detect and compensate for dielectric resonator oscillator (DRO) frequency drift.

DETAILED DESCRIPTION OF THE INVENTION

As utilized herein the terms "circuits" and "circuitry" refer to physical electronic components (e.g., hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z." As utilized herein, the term "exemplary" means serving as a non-limiting example, instance, or illustration. As utilized herein, the terms "for example" and "e.g." set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

Figure 1A:
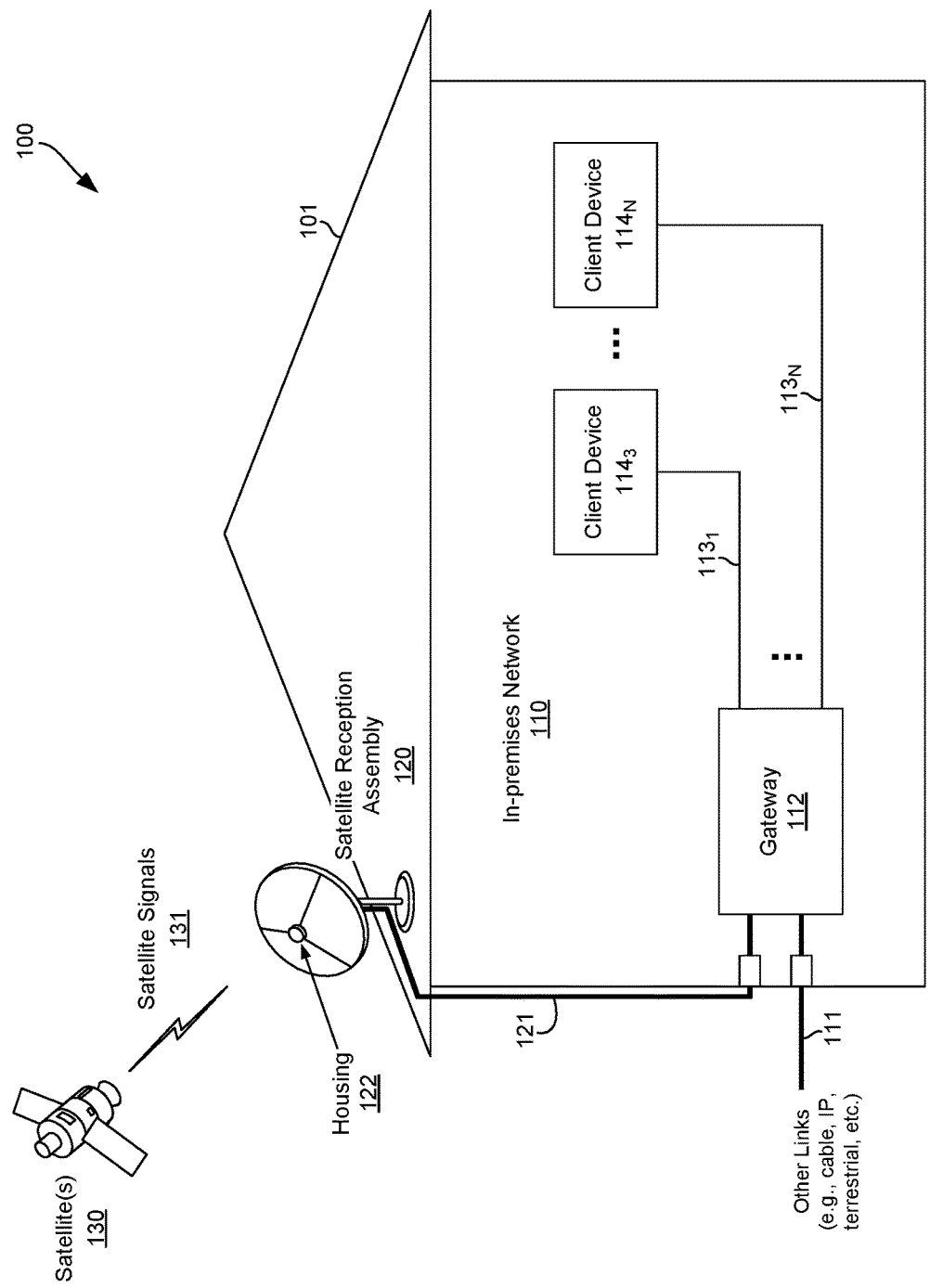
FIG. 1A illustrates an example communication topology.

FIG. 1A illustrates an example communication topology. Shown in FIG. 1A is a communication topology 100.

The communication topology 100 may comprise devices or systems (e.g., communication and/or electronic devices or systems), networks, and resources (e.g., storage, processing, and/or routing resources in distribution networks) for facilitating and/or supporting communications. For example, the communication topology 100 may be configured for use in distributing content and other data and/or for facilitating remote (e.g., Internet) access. The communication topology 100 may correspond to, for example, broadband, cable and/or satellite distribution topology. In the example implementation shown in FIG. 1A, the communication topology 100 may comprise an in-premises network 110, a satellite reception assembly 120, and one or more satellites 130.

The satellite 130 may be utilized to communicate satellite signals 131, which may typically only comprise downlink communication signals; however, the disclosure is not so limited, and in some instances the satellite signals 131 may also comprise uplink signaling. The satellite signals 131 may be utilized, for example, to broadcast satellite television content. In this regard, the satellite signals 131 may comprise Direct Broadcast Satellite (DBS) signals, in K, Ka, and/or Ku bands. The disclosure, however, is not limited to any particular type of satellite signal. While only satellite(s) 130 may be shown in FIG. 1A, the communication topology 100 may comprise other types of "headends," each comprising suitable circuitry for performing headend related functions, such as within a particular distribution topology—e.g., for a particular type of communication setup, using one or more particular protocol(s), and/or via particular type(s) of connections. For example, other headends may be used in conjunction with cable, terrestrial, and/or broadband distribution topologies.

The satellite reception assembly 120 may be configured for satellite based communications (e.g., being installed on the roof of the premises 101, so as to allow reception of satellite based broadcasts, and, in some instances, transmission—i.e. uplink, of satellite communications). For example, the satellite reception assembly 120 may be a satellite "dish". In this regard, the satellite reception assembly 120 may comprise, for example, a signal reflector (e.g., a parabolic reflector) which may be used for capturing satellite signals (e.g., the satellite signals 131), such as by reflecting them into a particular point (e.g., focal point of the parabolic reflector).

The satellite reception assembly 120 may also comprise circuitry operable to receive and/or process the satellite signals. For example, the circuitry may be incorporated into a housing 122, which may be mounted on a boom at or near the focal point of the parabolic reflector. In this regard, such circuitry (in the housing 122) may be configured for capturing and handling satellite signals—e.g., processing captured satellite signals, such as to recover data carried therein (e.g., television channels, media content, etc.), and generating one or more corresponding outputs, based on and/or incorporating at least some of the recovered data, which may be suitable for transmission to other devices over specific links (e.g., gateway 112, accessed via a link 121), whereby these devices may handle distribution of the data (e.g., within the in-premises network 110). For example, the circuitry may provide low-noise block down-converter (LNB) functionality, and/or additional functions (generating an output for communication on the link 121). The LNB functionality may comprise performing operations such as, for example, low-noise amplification, filtering, and/or down-converting, to enable generating corresponding IF signals. For example, the IF signals may be in the L-band, half-L-band (950-1450 MHz), extended-L-band (or 'Ext-L-band', 250-2114 MHz, 300-2350 MHz), or the like. Of course, a direct conversion architecture (i.e., zero IF or homodyne) may also be used, for direct conversion to baseband or DC without the use of IF signals.

The link 121 may comprise one or more wired, wireless, and/or optical links. The link 121 may comprise, for example, a wired (e.g., coaxial and/or twisted-pair) and/or wireless communication medium which carries physical layer symbols in accordance with, for example, DBS standards, but may also comprise other protocols, such as Ethernet or Multimedia over Coax Alliance (MoCA).

The in-premises network 110 may comprise a local network setup and/or be configured within a particular premises 101 (e.g., residential, industrial, commercial, educational, medical, etc.), to enable providing services within the premises 101. The services may comprise online (e.g., Internet) access/interactivity, access to television (or other similar multimedia or content distribution) broadcasts, and the like. Each in-premises network 110 may comprise a plurality of devices that may be used in conjunction with services and/or functions available in the network. For example, the in-premises network 110 may comprise at least one gateway 112 and one or more client devices 114.

The gateway 112 may comprise suitable circuitry for providing and/or supporting various services or functions in a particular location (e.g., the in-premises network 110), such as to support a plurality of client devices 114 (e.g., the client devices $114_1$-$114_N$, where N is an integer greater than 0) present in that location. The gateway 112 may communicate with the client devices 114 over point-to-point or indirect links 113 (e.g., links $113_1$-$113_N$, connecting the gateway 112 to the client devices $114_1$-$114_N$). The services or functions that may be provided and/or supported by the gateway 112 may pertain to, for example, broadband access, broadcast/television access, content distribution, and the like. The gateway 112 may be configured to support reception of signals communicated from external entities (e.g., cable, terrestrial, satellite, and/or IP head-ends), and process the signals as necessary for obtaining data (e.g., content) carried thereby, and outputting the data via corresponding signals over the internal links 113 to the client devices 114.

Similarly, the gateway 112 may be operable to receive signals communicated from the client devices 114, over the internal links 113, and process the signals as necessary for obtaining data and outputting the data via corresponding signals to the external entities. Accordingly, the term "gateway" in this disclosure refers to devices that may perform set-top box (STB) and/or receiver functions (e.g., for satellite, cable, terrestrial television, or the like), over-the-air reception (e.g., a DBS satellite dish assembly), WAN/LAN modem functions, and the like. In this regard, "set-top box" or "receiver" functions may comprise functions utilized in receiving and/or processing signals (carrying data) from head-ends (e.g., cable, satellites, and/or broadband head-ends), web servers, and the like to devices within the premises.

In some instances, at least some of the data utilized in the in-premises network 110 may be received from external sources, such as from broadband or broadcast sources (e.g., satellites, the terrestrial TV head-ends, and/or the cable head-ends). The gateway 112 may be utilized to service the in-premises network 110, such as, for example, by providing to the client devices 114 access to external networks/connections. In such instances, the gateway 112 may facilitate communication of signals between the client devices 114 and the external sources. For example, the gateway 112 may be utilized to route communications between cable head-ends 120 and one or more of client devices 114. In this regard, a client device 114 may receive from the cable head-end 120 streams containing, e.g., multimedia content. In some instances, the interactions with the cable head-end may be bi-directional. For example, client device 114 may transmit to the cable head-end 120 signals or streams, such as those containing user commands or requests (e.g., for particular content) or the like. Communications between client devices and head-ends may be configured in accordance with one or more particular protocol(s). For example, cable communications may be configured in accordance with DOCSIS protocol(s), satellite communications may be configured in accordance with DBS protocol(s), etc.

The client devices 114 may comprise devices which may be operable to utilize services or functions available in a particular location—e.g., those provided by the gateway 112. In this regard, the client devices 114 may be operable to communicate with the gateway 112, such as, for example, via one or more point-to-point links 113. For example, in instances where the gateway 112 is utilized to support broadband/television access and/or content distribution, the client devices 114 may comprise televisions and similar devices that may be used in consuming (e.g., displaying or playing) content that may be broadcasted (e.g., via terrestrial signals, satellite signals, cable signals, and/or over the Internet) and received via the gateway 112. The disclosure is not limited, however, to any particular type of client device. The links 113 between the gateway 112 and the client devices 114 may comprise, for example, wired, wireless, and/or optical links that may be suited for use in an environment such as the in-home network. For example, the links 113 may comprise wired connections (e.g., HDMI connections, Display Port links, Multimedia over Coax Alliance (MoCA) links, Ethernet connections, or the like), and/or wireless connections (e.g., WiFi, ZigBee, wireless USB, or the like).

In operation, the communication topology 100 may be used as a distribution system, for enabling distribution of data (e.g., multimedia or other content) to a plurality of end-users (e.g., client devices 114 in in-premises network 110). In this regard, the headends, such as the satellite 130, may be used to broadcast signals carrying particular data (e.g., content, such as TV channels or other multimedia) with communication topology 100. The data may be generated or obtained (e.g., from dedicated content sources) data, and may be processed for distribution with the communication topology 100. In this regard, the processing may comprise generating the satellite signals 131, which may be broadcast to a plurality of recipients (e.g., including the in-premises network 110). In some instances, the communication topology 100 may be configured to support upstream communications. In this regard, the in-premises network 110 may be operable to generate (and headends, such as the satellite 130, may be operable to receive and handle) upstream signals (e.g., the satellite signal 131, or similar signals). The upstream signals may be used, for example, to convey data (e.g., user generated content), user inputs/commands (e.g., requests for particular content), control data (e.g., status, errors, etc.), and the like.

Within the in-premises network 110, the gateway 112 and the client devices 114 may communicate with one another via the internal links 113 (e.g., HDMI connections, MoCA, WiFi, etc.). For example, the gateway 112 may receive signals originating from sources external to the in-premises network 110 (e.g., downlink broadcast signals, comprising, for example, signals received over link 121, corresponding to satellite signals 131 captured by satellite reception assembly 120, and/or signals received from other external link(s) 111, which may correspond to other feeds, such as cable television, IP, and/or terrestrial feeds) and may extract data carried therein (e.g., television or other multimedia content), and may then distribute that data within the premise network 110 using signals communicated over the internal links 113.

In uplink communications, the gateway 112 may receive (e.g., from the client devices 114) signals communicated within the in-premises network 110, may process these signals (such as to extract data carried therein), and may generate and transmit corresponding upstream signals, to the headends (e.g., the satellite 130) or other external entities, accessible via external networks (e.g., cable distribution network). Further, in some instances, the gateway 112 may receive signals originating within the in-premises network 110 (e.g., signals received over links 113 from particular client device(s) 114) and may then transmit corresponding signals within the in-premises network 110 (e.g., using signals communicated over internal links 113, which may targeted for other client devices 114).

In some instances, the satellite reception assembly 120 may be configured to concurrently receive a plurality of satellite signal beams (i.e., belonging to different broadcasts). The plurality of satellite signal beams may comprise signals transmitted by different satellites and/or different signals (e.g., with different polarization) transmitted by the same satellite. In such instances, accommodating concurrent receptions of different satellite feeds may be achieved by use of channel stacking and/or band stacking. Channel stacking may be implemented by taking multiple channels from different frequency bands and stacking or combining them together for transmission over the same physical medium (e.g., the link 121). Band stacking may be implemented by taking a plurality of frequency bands (or sub-bands) and stacking or combining them together for transmission.

For example, to enable and/or accommodate concurrent reception of multiple satellite feeds, the satellite reception assembly 120 may comprise suitable circuitry for supporting and/or performing integrated channel and/or band stacking. An example implementation is described in more detail with respect to FIG. 1B.

Nonetheless, while the integrated stacking is described with respect to satellite signals, the disclosure is not so limited, and a similar approach may be used with other types of feeds (e.g., cable, IP/broadband, etc.) where concurrent reception of multiple feeds, and stacking of content obtained therefrom, may be necessary.

Figure 1B:
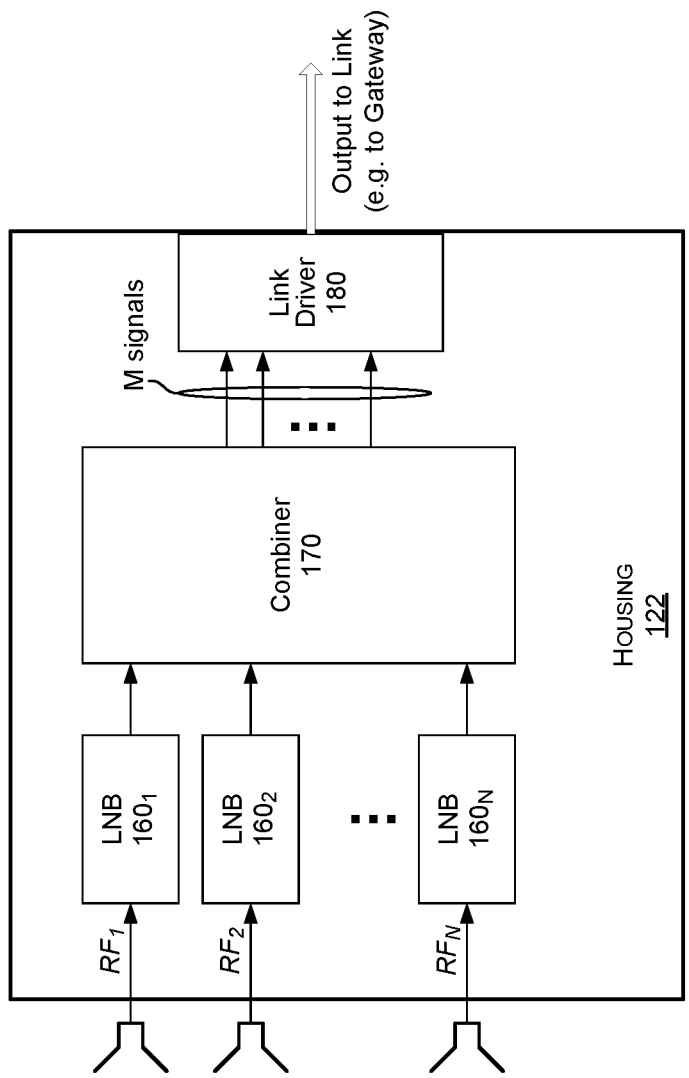
FIG. 1B illustrates an example housing component of a satellite receiver assembly that may support integrated stacking.

FIG. 1B illustrates an example housing component of a satellite receiver assembly that may support integrated stacking. Shown in FIG. 1B is an example (partial) implementation of the housing 122 of the satellite reception assembly 120 of FIG. 1A.

The housing 122 may be configured to support integrated stacking, for enabling channel and/or band stacking, to facilitate servicing multiple users based on multiple feeds. In this regard, the housing 122 may comprise a plurality of low noise block downconverters (LNBs) $160_1$-$160_N$, a combiner 170, and a link driver 180.

Each of the LNBs $160_1$-$160_N$ may comprise circuitry operable to receive and handle RF satellite signals, which may be captured via a reflector of a satellite reception assembly. In this regard, each LNB $160_i$ may be configured to perform such functions as low-noise amplification, filtering, and downconverting on a particular received RF (satellite) signals, to enable generating corresponding IF signals. In this regard, the IF signals may be in the L-band, half-L-band (950-1450 MHz), extended-L-band (250-2150 MHz, 300-2350 MHz), and the like. The disclosure, however, is not so limited, and the IF signals may span any suitable frequency range. Of course, again, a direct conversion architecture (i.e., zero IF or homodyne) may also be used, for direct conversion to baseband or DC without the use of IF signals. Having N LNBs in the housing 122, as illustrated in FIG. 1B, may allow receiving N (an integer number) satellite (RF) signals, labeled $RF_1$ to $RF_N$. In this regard, each $RF_i$ signal may correspond to a unique/distinct satellite signal, with the signals differing, for example, based on the source or the polarization (e.g., $RF_1$ may correspond to a first polarization of a first satellite, $RF_2$ may correspond to second polarization of the first satellite, $RF_3$ may correspond to a first polarization of a second satellite, and so on).

The combiner 170 may be configured to process and combine input signals corresponding to the received RF signals ($RF_1$ to $RF_N$)—i.e., outputs of the LNBs $160_1$-$160_N$. For example, the combiner 170 may be operable to amplify, downconvert, filter, and/or digitize at least a portion of the input signals. The combiner 170 may be configured to support full-spectrum—i.e., to capture an entire spectrum of each of one or more protocols of interest may be concurrently digitized, or to only digitize a portion of the input signals, such as depending on which channels (or sub-bands) in the signals are selected by client devices (e.g., which television channels are being consumed by the client devices). Once the processing of the input signals (or portions thereof) is complete, the combiner 170 may be operable to recover information carried in the signals (e.g., one or more channels contained therein), and may generate output signals carrying the recovered information. The output signals may be sent to the link driver 208, for transmission thereby (e.g., to the gateway). In some instances, the output signals may be processed in the combiner before being forwarded to the link driver 208. For example, the combiner 170 may be operable to convert to analog, upconvert, filter, and/or amplify the output signals.

The link driver 180 may be operable to process signals generated via the combiner 170 (e.g., comprising recovered information) and generate signals that may be transmitted onto a link to a corresponding link-peer device, such as a gateway/STB (e.g., link 121 to gateway 112 of FIG. 1A) in a format supported by the link-peer device. For example, the link driver 180 may be operable to packetize and transmit data received via signals $RF_1$-$RF_N$, in accordance with one or more networking standards (e.g., Ethernet, Multimedia over Coax Alliance (MoCA), DOCSIS, and the like) to a link-peer device that receives satellite data using such standards. The link driver 180 may also be operable to perform operations (e.g., digital to analog conversion, modulation, frequency conversion, etc.) for outputting the data according to one or more multimedia standards (e.g., ATSC, DVB-S, ISDB-S, and the like) to enable receiving satellite data by devices using such standards. The output of the link driver 180 may comprise a plurality of IF signals, in a particular range to which the link-peer device (e.g., gateway 112) may tune. For example, each of the IF signals may be in the L-band (950 MHz to 2150 MHz).

In various example implementations, the housing 122 may be configured to handle and/or support channel stacking and/or band stacking. For example, the LNBs $160_1$-$160_N$, the combiner 170, and/or the link driver 180 may be implemented based on or using integrated stacking based architecture. In this regard, integrated stacking based architectures may comprise, for example, analog stacking architectures or digital stacking architectures. For example, in an example implementation, an analog stacking based architecture may be used, and may comprise integrated filters for example. The filters may be configured to filter through particular portions (e.g., corresponding to particular channels or sub-bands). The analog stacking based architecture may provide analog capture utilizing an analog multiple input and multiple output crossbar (Xbar). The Xbar may be configured such that one or more inputs (comprising particular channels or sub-bands) may be combined and mapped to one or more outputs. In another example implementation, a digital stacking based architecture may be used, to provide digital capture using full band stacking. The digital stacking based architecture may be operable to provide digital capture utilizing a digital multiple input and multiple output digital crossbar. Furthermore, to allow for the digitization, the digital stacking based architecture may be configured to provide analog-to-digital conversion (and, if needed, digital-to-analog conversion, such as when the system output need be analog). An example implementation of digital stacking based architecture is described in more detail with respect to FIG. 2.

Figure 2:
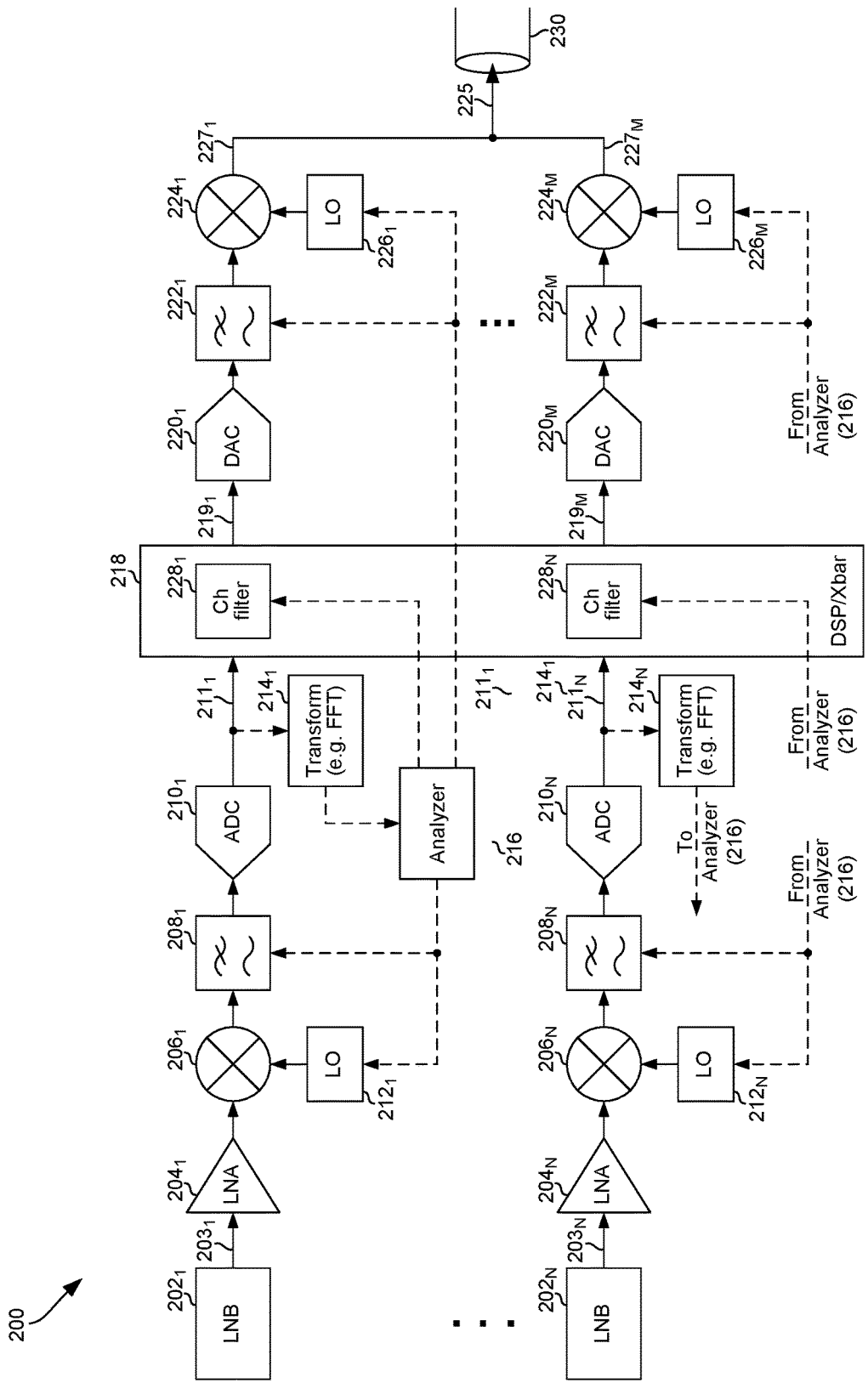
FIG. 2 illustrates an example system that may be used in an outdoor unit operable to perform detection and compensation of dielectric resonator oscillator (DRO) frequency drift, in accordance with the present disclosure.

FIG. 2 illustrates an example system that may be used in an outdoor unit operable to perform detection and compensation of dielectric resonator oscillator (DRO) frequency drift, in accordance with the present disclosure. Shown in FIG. 2 is an example system 200, which may be used in (or correspond to) an outdoor unit (ORD).

The system 200 may comprise suitable circuitry for processing signals, and to particularly perform and support detection and compensation of dielectric resonator oscillator (DRO) frequency drift. The system 200 may be configured to receive and process a plurality (N, an integer) of input signal, combining them (e.g., which may comprise performing channel and/or band stacking) into a plurality (e.g., M, an integer) of channel signals, which may be combined into a single channel-stacked signal (e.g., signal 225) that is configured for communication over a particular connector (e.g., connector 230, which may be a coaxial cable). For example, the system 200 may correspond to at least a portion of the components and/or circuitry of the housing 122, as described with respect to FIG. 1B.

As shown in the example implementation depicted in FIG. 2, the system 200 may comprise a plurality of plurality of LNBs $202_1$-$202_N$, a plurality of low noise amplifier (LNA) circuits $204_1$-$204_N$, a plurality of mixer circuits $206_1$-$206_N$, a plurality of filter circuits $208_1$-$208_N$, a plurality of analog-to-digital converter (ADC) circuits $210_1$-$210_N$, a plurality of local oscillator (LO) circuits $212_1$-$212_N$, a plurality of transform (e.g., fast Fourier transform (FFT)) circuits $214_1$-$214_N$, an analyzer circuit 216, a digital signal processing (DSP) and crossbar (Xbar) circuit 218, a plurality of digital-to-analog converter (DAC) circuits $220_1$-$220_M$, a plurality of filter circuits $222_1$-$222_M$, a plurality of mixer circuits $224_1$-$224_M$, and a plurality of local oscillator (LO) circuits $226_1$-$226_M$. Further, the DSP and Xbar circuit 218 may comprise a plurality of channel filter circuits $228_1$-$228_N$.

The LNBs $202_1$-$202_N$ may be substantially similar to the LNBs $160_1$-$160_N$ described with respect to FIG. 1A, and each may be similarly operable to receive and handle an RF signal (e.g., a satellite signal, which may be captured via a reflector of a satellite reception assembly).

The DSP and Xbar circuit 218 circuit may be operable to perform digital processing on one or more inputs, and to perform crossbar switching between the one or more inputs and one or more outputs, such as to facilitate a desired integrated stacking. In particular, the DSP and Xbar circuit 218 may be configured to receive and apply digital processing to the one or more inputs (comprising particular channels or sub-bands) such that these inputs may be combined and mapped to the one or more outputs. The DSP and Xbar circuit 218 may be operable to perform full or partial band stacking.

The analyzer circuit 216 may be operable to analyze various signals within the system 200, such as to enable determining suitable adjustments to the operations (and thus performance) of the system 200 and/or particular components thereof. For example, the analyzer circuit 216 may receive and analyze various signals within the system 200, to determine any necessary adjustments or parameters relating to detection and compensation of DRO drift.

In an example operation of the system 200, in accordance with the example implementation shown in FIG. 2, a number of signals 203 may be received via the plurality of LNBs $202_1$-$202_N$. The number of signals may be equal to the number of LNBs (e.g., N), as shown in FIG. 2. Nonetheless, in some instances fewer number of signals (than LNBs) may be received—e.g., where one or more of the LNBs receive two polarities. The signals 203 may be, for example, satellite signals. For example, each signal $203_n$ ($1 \leq n \leq N$) may be an L-band signal from 950 to 2150 MHz, a "half-L-band"

signal from 950 to 2450 MHz or from 2450 to 2150 MHz, an "extended-L-band" signal from 250 to 2150 MHz or 301 to 2350 MHz, or the like. This disclosure, however, is not so limited, and the signals 203 may span any suitable frequency range and/or may correspond to different types of signals (e.g., non-satellite signals).

After reception via the LNB $202_n$, the signal $203_n$ may be input to the corresponding LNA circuit $204_n$, which may be operable to amplify the signal $203_n$. The corresponding mixer circuit $206_n$ is then operable to downconvert the output of the LNA circuit $204_n$ to a lower frequency (e.g., baseband), determined, for example, by the frequency of the corresponding LO circuit $212_n$, for example. Next, the corresponding filter circuit $208_n$ is operable to filter the output of the mixer circuit $206_n$, such as to filter out undesired frequencies. The corresponding ADC circuit $210_n$ is then operable to digitize the output of filter circuit $208_n$, and the output of ADC circuit $210_n$ (e.g., signal $211_n$) is conveyed to the DSP and Xbar circuit 218. The DSP and Xbar circuit 218 may process the signal $211_n$ (along with other inputs, corresponding to outputs of other ADC circuits $210_1$-$210_N$). In this regard, the channel filter circuit $228_n$ in the DSP and Xbar circuit 218 may be operable to apply channel filtering to the signal $211_n$ conveyed from the corresponding ADC circuit $210_n$, such as to select one or more desired channels (e.g., for stacking) from signal $211_n$.

A number (e.g., M) of channels may be selected via the N channel filter circuits $228_1$-$228_N$. The DSP and Xbar circuit 218 may be operable to perform a crossbar switching function for outputting any of the selected M channels to any one of the DAC circuits $220_1$-$220_M$, as digital signals $219_1$-$219_M$. Each DAC circuit $220_m$ ($1 \leq m \leq M$) is operable to convert a corresponding digital signal $219_m$ to corresponding analog signal. The corresponding filter circuit $222_m$ is then operable to filter out undesired frequencies in a signal output by the DAC circuit $220_m$. Then, the corresponding mixer circuit $224_m$ is operable to upconvert the output of the filter circuit $222_m$ to a desired frequency, determined, for example, by a frequency of a corresponding LO circuit $226_m$, for stacking the M outputs of the M DAC circuits $220_1$-$220_M$ onto the connector 230.

In various implementations, dielectric resonator oscillator (DRO) frequency drift detection and compensation may be performed during operations of the system 200. In an example implementation, signals $211_1$-$211_N$ (outputs of the ADC circuits $210_1$-$210_N$) may be analyzed by the analyzer circuit 216 (e.g., after conversion to the frequency domain via the transform (e.g., FFT) circuits $214_1$-$214_N$) to determine the frequency offsets (resulting from, for example, frequency drift of the DROs of the LNBs $202_1$-$202_N$) of the signals $203_1$-$203_N$. Each of the transform circuits $214_1$-$214_N$ may be operable to apply, for example, fast Fourier transform (FFT), to signals that are to-be analyzed in the analyzer circuit 216 (e.g., signals $211_1$-$211_N$, the outputs of the ADC circuits $210_1$-$210_N$) for estimating signal spectrum and conversion to frequency domain. Nonetheless, the disclosure is not limited to use of FFT, and any other suitable scheme for signal spectrum estimation and/or conversion to frequency domain (e.g., discrete cosine transform (DCT), Wavelet transform, etc.) may be used. An example analysis in accordance with an implementation of the present disclosure may be as described below in more detail with reference to FIG. 4.

Upon the analyzer circuit 216 determining the DRO frequency offsets, it then controls one or more parameters of the system 200 to compensate for the offsets. The parameters may include, for example, the frequency of each LO circuit $212_n$, the frequency of each LO circuit $226_1$, the frequency (or frequencies) of the passband(s) and/or stopband(s) of each filter circuit $208_n$, the frequency (or frequencies) of the passband(s) and/or stopband(s) of each filter circuit $228_n$, and the frequency (or frequencies) of the passband(s) and/or stopband(s) of each filter circuit $222_m$. The analyzer circuit 216 may automatically control the parameters to track the DRO frequency drift. The analyzer may then adjust the frequencies of the LO circuits 212 and 226 to compensate for the frequency drift such that passband(s) and/or stopband(s) of each filter circuit $228_n$ is better centered on the channel(s) to be selected by filter circuit $228_n$. In some instances, different characteristics of components that are controlled based on the analysis (e.g., adjusting of filter's passband and stopband) may be done independently. Thus, each of a filter's passband and stopband may be controlled (e.g., adjusted) independently. An example DRO frequency drift, in accordance with the present disclosure, is illustrated in more detail with respect to FIGS. 3A-3D.

The DRO tracking and correction based thereon (e.g., compensation therefor), or mechanisms used such tracking and/or correction, may be specifically selected and/or configured to optimize overall performance—e.g., minimize phase disturbance to device (e.g., set-top box) receiving the intermediate frequency signals. For example, when a gateway (or STB) requests tuning to a particular channel, the output signals may be generated such that to ensure that the signal (or at least the portion thereof corresponding to the requested channel) would be at the right frequency rather than with the frequency offset. Doing so would improve performance as it would improve the lock time of the STB. Such estimate may be very good estimate based on channels with high SNR, which may in general be better than what the STB may "see." In an example implementation, the tracking may be performed continually—e.g., using a very slow phase ramp, which may be set to the correct DRO offset required for maintaining the output frequency.

In an example implementation, each LO circuit $226_m$ may be controlled to compensate for the determined frequency offset of the signal $203_n$ from which the signal $219_m$ was selected. In this manner, from the perspective of a peer device receiving the system output signal 225 (e.g., a set-top-box, not shown; connected to the other end of connector 230), the channel $227_m$ may also be at the same frequency (within a tolerance) in the signal 225. This may reduce the range of frequencies that the set-top-box has to search when attempting to tune to channel $227_m$ of the signal 225. Adjustments of the frequency of the LO circuit $212_n$ and the frequency (or frequencies) of the LO circuit $226_m$ which are processing a channel received via signal $203n$ may be synchronized, to minimize phase glitches while tracking the frequency offset.

FIGS. 3A-3D illustrate an example DRO frequency drift adjustment, in accordance with the present disclosure, that is performed in an example system (e.g., an outdoor unit (ODU), or portion thereof), which is operable to perform detection and compensation of dielectric resonator oscillator (DRO) frequency drift, such as the system 200 of FIG. 2. In this regard, references are made to components of the system 200.

FIG. 3A illustrates the need for additional margin in the bandwidth of channel filters when dielectric resonator oscillator (DRO) frequency drift is not compensated for in a system. Shown in FIG. 3A is an input signal 301 comprising a plurality of channels.

As illustrated in FIG. 3A, a filter (e.g., the channel filter circuit $228_n$) may be used in selecting a particular channel (e.g., channel 306, indicated by hashed lines in FIG. 3A), such as to be combined into a single channel-stacked signal. Without tracking for DRO frequency drift, the channel filter circuit $228_n$ used in selecting the desired channel (e.g., channel 306) may need to be of sufficiently-wide bandwidth to ensure that, even for worst-case DRO frequency drift, the channel to be selected is within the passband 302 of the filter. If the bandwidth was narrower (e.g., passband 304 shown in FIG. 3A), then part of the desired channel may be outside the passband during worst-case frequency drift. This could prevent successful decoding and demodulation of the signal. A consequence of the need for the wide passband 302 is that much more of the adjacent channels falls within the passband, which may degrade SNR at the outputs of the DAC circuit $220_m$. In addition to degraded SNR, the wider channel filter bandwidth 304 limits how close to one another in frequency the selected channels can be placed when generating a channel-stacked output signal (e.g., signal 225 of FIG. 2).

FIG. 3B illustrates a plurality of stacked channels output by a system that does not compensate for dielectric resonator oscillator (DRO) frequency drift. Shown in FIG. 3B is a channel-stacked signal 311. The channel-stacked output signal 311 may comprise a plurality of stacked channels, one of which being the channel 306 of FIG. 3A.

As described in more detail with respect to FIG. 3A, adjacent channel leakage may occur when wide passband is used, to counter possible (worst-case) frequency drift. This is illustrated in FIG. 3B, where portions 310 and 312, around channel 306 in the channel-stacked output signal 311, represent areas where adjacent channel leakage would occur.

FIG. 3C illustrates the ability to reduce margin in the bandwidth of an ODU's channel filters when dielectric resonator oscillator (DRO) frequency drift is compensated for in a system. Shown in FIG. 3C is the input signal 301.

As illustrated in FIG. 3C, when the DRO frequency drift is tracked and compensated for (e.g., by adjustment of LO frequencies and/or adjustment of filter poles/zeros) such that the passband of channel filter circuit $228_n$ remains centered on the channel to be selected (channel 306) by channel filter circuit $228_n$, then the narrower bandwidth 302 would be sufficient. This results in less adjacent channel leakage, as illustrated in FIG. 3D.

FIG. 3D illustrates a plurality of stacked channels output by a system that is operable to detect and compensate for dielectric resonator oscillator (DRO) frequency drift. Shown in FIG. 3D is a channel-stacked signal 321, which may be generated by a system that is operable to perform detection and compensation of dielectric resonator oscillator (DRO) frequency drift, such as the system 200 of FIG. 2.

The channel-stacked output signal 321 may comprise a plurality of stacked channels, one of which being the channel 306 of FIG. 3A. The channel-stacked output signal 321 is generated with the tracking (and compensation for) DRO frequency drift. As illustrated in FIG. 3D (particularly when compared to output signal 311 shown in FIG. 3B), tracking and compensating for DRO frequency drift results in less adjacent channel leakage (illustrated by narrower portions 310 and 312), and improved SNR. Further, the narrower bandwidth 304 permits the selected channels to be placed closer to one another in the channel-stacked signal 321. For example, as shown by comparing FIGS. 2B and 2D, use of narrower channel filter bandwidth 304 enables six channels to be stacked in the same bandwidth that can only accommodate four channels when the channel filter bandwidth is 302. The narrower bandwidth 304 may also result in lower group delay degradation as compared to bandwidth 302.

Figure 4:
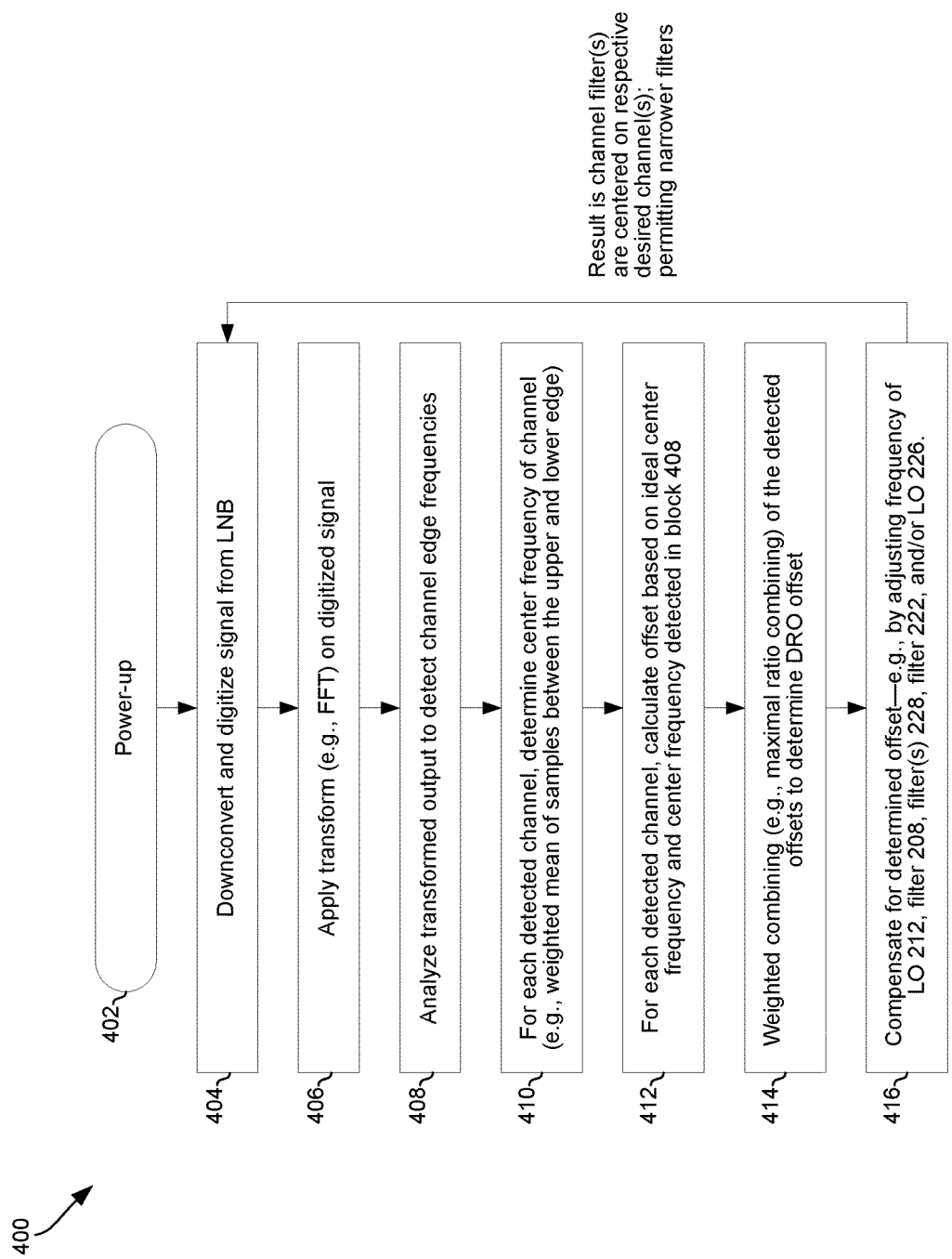
FIG. 4 depicts a flowchart of an example process for detection and compensation of dielectric resonator oscillator (DRO) frequency drift, in accordance with the present disclosure.

FIG. 4 depicts a flowchart of an example process for detection and compensation of dielectric resonator oscillator (DRO) frequency drift, in accordance with the present disclosure. Shown in FIG. 4 is flow chart 400, comprising a plurality of example steps (represented as blocks 402-416), which may be performed in a suitable system (e.g., system circuit 200 of FIG. circuit 2) to provide DRO detection and compensation.

In step 402, the system (e.g., system/ODU circuit 200) powers up.

In step 404, an input signal (e.g., signal $203_n$) may be received, such as via an LNB (e.g., LNB $202_n$). The signal may then be processed. For example, the signal $203_n$ may be processed by the LNA circuit $204_n$, the mixer circuit $206_n$, the filter circuit $208_n$ and the ADC circuit $210_n$, resulting in corresponding digital time-domain signal $211_n$.

In step 406, the post-processing signal (e.g., signal $211_n$) may be used for DRO-related analysis, which may be performed by a dedicated component (e.g., the analyzer circuit 216). In some instances, the signal (or copy thereof) may be operated on, such as to make it more suitable for use by an analysis performing component. For example, a fast Fourier transform (FFT) may be applied (e.g., by transform circuit $214_n$) to a copy of the signal $211_n$, to generate a frequency-domain representation of signal $211_n$ that is conveyed to analyzer circuit 216. The analysis may be performed in one or more steps (e.g., steps 408-414).

In step 408, channel detection may be performed. For example, the analyzer circuit 216 may analyze the frequency-domain information to detect channels (e.g., 40 MHz wide channels) present in the signal $211_n$ and determine the upper edge frequency and the lower edge frequency of each detected channel of the signal $211_n$.

In step 410, center frequencies for detected channels may be determined. For example, the center frequency of each detected channel of the signal $211_n$ may be determined, by the analyzer circuit 216, such as from a weighted mean of the determined upper edge frequency and lower edge frequency of the channel.

In step 412, frequency offset for each detected channel may be determined. For example, a frequency offset may be determined for each detected channel of signal $211_n$ by determining the difference between the center frequency of the channel (determined in step 410) and the ideal frequency of the channel (based on the applicable standard or specification).

In step 414, the overall frequency offset for the analyzed signal (e.g., signal $211_n$) may be determined. For example, the offsets of the various detected channels of the signal $211_n$ may be combined (e.g., using maximal ratio combining) to determine a frequency offset of the signal $211_n$.

In step 416, adjustment(s) to the system or components thereof may be determined based on the DRO analysis. For example, the analyzer circuit 216 may determine and apply parameters adjustment for the system 200 (or components thereof) based on the outcome of the analysis (e.g., the overall frequency offset determined in step 414). The analyzer circuit 216 may adjust, for example, by an amount equal to the offset determined in step 414, the frequency of LO circuit $212_1$, and the frequency of any of the LO circuits circuit $226_1$-$226_M$ that are processing channels selected from signal $211_n$. The outcome of the analysis and the adjustment determined and made based thereon may be enhanced performance in the system—e.g., channel filter(s) that may be centered on respective desired channel(s); permitting narrower filter bandwidths.

After step 416 the process may return to step 404. In this manner, the system may continually, occasionally, or periodically update the determined offset to track frequency drift of the DRO.

In an example implementation, the analyzer circuit 216 may also consider other factors in the analysis, and make adjustments based on such other factors—e.g., determine tilt in each channel and compensate for the tilt (e.g., by adjusting gain of and/or output levels of the DAC circuits circuit $220_1$-$220_M$).

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, various embodiments in accordance with the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

Various embodiments in accordance with the present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
  a receiver circuit operable to receive an input signal; and
  a processing circuit operable to:
    detect one or more channels in said input signal;
    determine frequency offset for each channel of said one or more detected channels;
    determine dielectric resonator oscillator (DRO) frequency drift based on combining frequency offsets of said one or more detected channels;
    determine, based on said DRO frequency drift, one or more adjustments for compensating for said DRO frequency drift; and
    synchronize applying said one or more adjustments to different circuits used during one or more of: said receiving of said input signal, processing of said input signal, processing of an intermediate signal generated based on said processing of said input signal, and generating of an output signal corresponding to said input signal.

2. The system of claim 1, wherein said processing circuit is operable to determine said DRO frequency drift based on analysis of an intermediate signal generated during processing of said input signal.

3. The system of claim 2, wherein said processing circuit is operable to process said intermediate signal to make it suitable for said analysis.

4. The system of claim 3, wherein said processing of said intermediate signal comprises applying signal spectrum estimation and conversion to frequency domain.

5. The system of claim 1, wherein said processing circuit is operable to determine for each detected channel, during said analysis, an upper edge frequency and a lower edge frequency.

6. The system of claim 5, wherein said processing circuit is operable to determine, during said analysis, a center frequency for each detected channel, based on said upper edge frequency and said lower edge frequency.

7. The system of claim 6, wherein said processing circuit is operable to determine, during said analysis, a frequency offset for each detected channel, based on said determined center frequency.

8. The system of claim 7, wherein said processing circuit is operable to determine, during said analysis, an overall frequency offset for said input signal based on determined frequency offsets for all detected channels.

9. The system of claim 1, wherein said one or more adjustments comprise at least one adjustment relating to optimizing capturing at least one of said one or more detected channels.

10. A method comprising:
  receiving an input signal;
  detecting one or more channels in said input signal;
  determining frequency offset for each channel of said one or more detected channels;
  determining dielectric resonator oscillator (DRO) frequency drift based on combining frequency offsets of said one or more detected channels;
  determining, based on said DRO frequency drift, one or more adjustments for compensating for said DRO frequency drift; and
  synchronizing applying of said one or more adjustments to one or more of: said receiving of said input signal, processing of said input signal, processing of an intermediate signal generated based on said processing of said input signal, and generating of an output signal corresponding to said input signal.

11. The method of claim 10, comprising determining said DRO frequency drift based on analysis of an intermediate signal generated during said processing of said input signal.

12. The method of claim 11, comprising processing said intermediate signal to make it suitable for said analysis.

13. The method of claim 12, comprising applying, during said processing of said intermediate signal, signal spectrum estimation and conversion to frequency domain.

14. The method of claim 11, comprising determining for each detected channel, during said analysis, an upper edge frequency and a lower edge frequency.

15. The method of claim 14, comprising determining, during said analysis, a center frequency for each detected channel, based on said upper edge frequency and said lower edge frequency.

16. The method of claim 15, comprising determining, during said analysis, a frequency offset for each detected channel, based on said determined center frequency.

17. The method of claim 16, comprising determining, during said analysis, an overall frequency offset for said input signal based on determined frequency offsets for all detected channels.

18. The method of claim 10, wherein said one or more adjustments comprise at least one adjustment relating to optimizing capturing at least one of said one or more detected channels, for inclusion in said output signal.

* * * * *